Nov. 23, 1971 SHIGEZO TANAKA ET AL 3,621,564
FACE-DOWN-BONDED SEMICONDUCTOR DEVICE AND PROCESS FOR MANUFACTURING SAME
Filed May 7, 1969 3 Sheets-Sheet 1
FIG. 1a
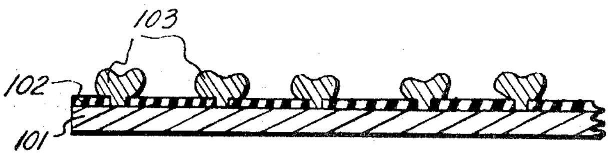
FIG. 1b
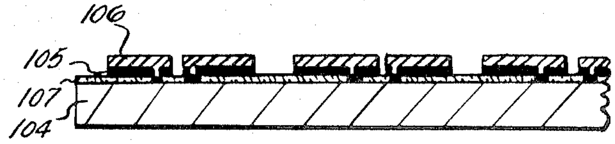
FIG. 1c
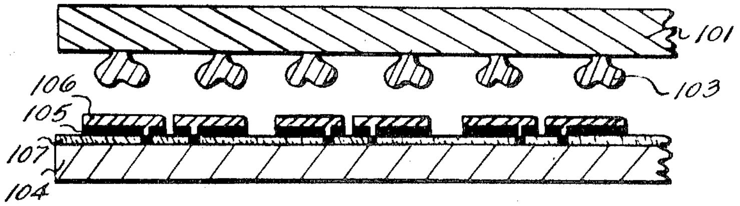
FIG. 1d
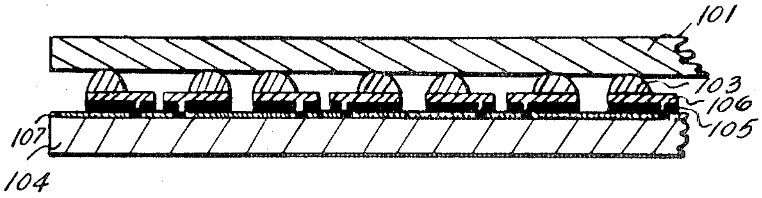
FIG. 1e
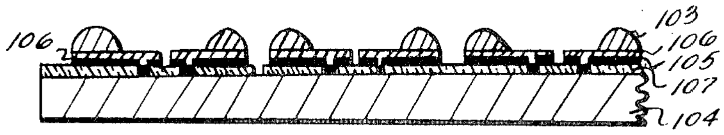
FIG. 1f
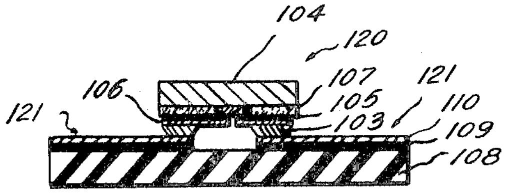
FIG. 1g
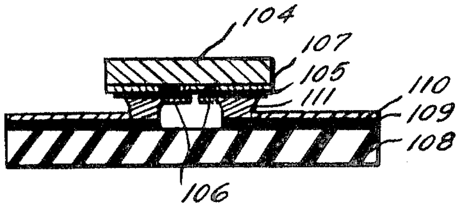
FIG. 1
INVENTORS
SHIGEZO TANAKA
KATSUJI MINAGAWA
BY Hopgood & Calimafde
ATTORNEYS INVENTORS
SHIGEZO TANAKA
KATSUJI MINAGAWA
BY Hopgood & Calimafde
ATTORNEYS INVENTORS
SHIGEZO TANAKA
KATSUJI MINAGAWA
BY Hopgood & Calimafde
ATTORNEYS

United States Patent Office 3,621,564

Patented Nov. 23, 1971

3,621,564

PROCESS FOR MANUFACTURING FACE-DOWN-BONDED SEMICONDUCTOR DEVICE

Shigezo Tanaka and Katsuji Minagawa, Tokyo, Japan, assignors to Nippon Electric Company, Limited, Tokyo, Japan Filed May 7, 1969, Ser. No. 822,484
Claims priority, application Japan, May 10, 1968, 43/31,406
Int. Cl. B01j *17/00;* H01l *7/24*
U.S. Cl. 29—590 4 Claims

ABSTRACT OF THE DISCLOSURE

A face-down-bonded semiconductor device is disclosed in which the electrodes of a semiconductor element and of the substrate carrying that element by face-down-bonding has a surface formed of a first metal which readily forms an alloy with a second metal, that alloy having the characteristic that its melting point is higher than that of the second metal.

This invention relates to a face-down-bonded semiconductor device.

Face-down-bonded semiconductor devices are made by forming metallic projections on part of semiconductor element electrodes and directly bonding the projections at their ends to protruding ends of stem leads by way of, for example, ultrasonic or thermal pressure bonding. This fabrication technique is known as face-down-bonding. Most important of the factors involved therein are the manner of forming the projections and from what material the projections are to be formed. In particular, it is difficult to form small buttons of metal to be projected from the element surface by a height in the range of tens of microns.

It is an object of the present invention to provide a face-down-bonded semiconductor device having electric connections of high reliability with thermal and chemical stability.

It is another object of the present invention to provide a process for forming the above-mentioned projections easily and with good dimensional accuracy.

The face-down-bonded semiconductor device according to the present invention is characterized in that either or both electrodes of a semiconductor element and the electrodes of a substrate carrying the element by face-down-bonding has a surface formed of a first metal such as silver, gold, platinum or palladium which readily alloys with a second metal such as tin or lead and which satisfies the requirement that the resulting alloy have a melting point higher than that of the second metal to be used, and that the connecting portions by face-down-bonding of the semiconductor element and the substrate are formed of an alloy consisting of the first metal and the second metal and having a melting point higher than that of the second metal.

The face-down-bonded semiconductor device as mentioned above can be produced through a process which comprises at least the following three steps:

(1) At first, projections are formed on part of the semiconductor element electrodes, which projections are made of either said second metal or an alloy consisting of said second metal and a small amount of said first metal and having a melting point nearly equal to or less than that of said second metal. The surface layer of the semiconductor element electrodes may be said first metal or another metal capable of easily adhering to said second metal or to an alloy of said first and second metals.

(2) Then, the semiconductor element is placed on a substrate having electrodes corresponding to those of the element and whose electrode surface is formed of said first metal, in such a manner that said projections may adhere closely to the electrodes of said substrate.

(3) Thereafter, the metal of the projections is made molten by heating at a temperature between the melting point of the projection metal and that of the first metal to produce an alloy of said first and second metals that has a melting point higher than that of said second metal, at the connecting portions between the electrodes of the element and those of the substrate. When the molten projections are in contact with the electrodes of the substrate having an uppermost layer of the first metal (gold, silver, platinum, palladium or the like), the mutual diffusion of the molten projection metal and the first metal takes place up to the arrival at an equilibrium, with the results that a solidifying temperature of the molten body arises and that an alloy of higher solidifying temperature is formed. In other words, a relatively low temperature suffices for the bonding of the element and substrate, but once bonded, the melting temperature rises to a considerable degree to make it hardly fusible and to enable the product to be handled thereafter with ease.

Where it is necessary to put the face-down-bonded semiconductor element of this invention into a casing which is then hermetically sealed by use of a sealing material such as a low-melting-point glass or a low-melting-point solder, the heating during the step (3) mentioned above may at the same time be used for performing the sealing work. In detail, the sealing material must be softened or made molten in the sealing process by heating which inevitably raises the temperature of the semiconductor element put within the casing. Therefore, if a sealing material is used having a working temperature (or softening or melting temperature) higher than the melting point of the metal of the projections, it is possible to perform both the step (3) and the sealing work at the same time. In this connection, a working temperature of the sealing material should preferably be lower than about 600° C. in order not to adversely affect the semiconductor element.

Formation of the projections in the step (1) may be done by various known methods, however, the following method is very convenient:

This method comprises the steps of providing a layer of a second metal such as lead or tin in a pattern corresponding to the electrodes of a semiconductor element on the surface of a plate of a metal selected from the group consisting of chromium, molybdenum, tungsten and titanium or of a plate member having at that surface a layer of such selected metal, melting said second metal with the application of heat, causing said second metal in a molten state to adhere intimately to the electrodes of the semiconductor element having at the electrode surface a first metal such as silver, gold, platinum or palladium which readily alloys with said second metal to give an alloy having a melting point higher than that of said second metal, and removing said metal plate or plate member from said element, thereby to form projections of the second metal on the electrodes of the element.

This method takes advantage of the following phenomena when metallic molybdenum, chromium, tungsten, or titanium is electroplated on its surface with another metal, the deposited metal does not exhibit satisfactory adhesion to such a substrate metal. If metallic molybdenum, chromium, tungsten, or titanium is plated on a certain region of its surface with another metal to form a plated layer of a predetermined size while the rest of the surface region is covered with an organic material such as a so-called photo-resist, the greater the plating thickness grows the more the width of the plated layer expands, If the electrodeposited metal, is a low-melting-point metal such as lead or tin, it will melt on slight heating to give a globular shape; when the molten, low-melting-point metallic globules are bonded to the electrode regions of a semiconductor element having an uppermost metal layer of gold, silver, platinum, palladium or the like, the amounts up to arrival at an equilibrium are mutually diffused depending upon the heating temperature, the amount of molten metal globules and the amount of the metal layer such as of gold, silver or the like, with the results that on cooling, the component of higher solidifying temperature is first separated; that in such cases metallic molybdenum, chromium, tungsten, or titanium remains mostly unmolten into the electrodeposited metal; and because it is feasible to permit the solidification of only the portions of the globules in the vicinity of the electrode regions of the element while maintaining the portions in contact with said metallic plate or plate member in the molten state, the metallic plate or plate member can be removed without difficulty.

These and other principles, features and advantages of the present invention will become apparent from the following more detailed description of preferred embodiments of the invention, taken in conjunction with the accompanying drawings.

In the drawings:

FIGS. 1(*a*) to (*g*) are sectional views illustrating the sequential steps of the fabrication of a face-down-bonded semiconductor device according to a first embodiment of this invention;

Figure 2:
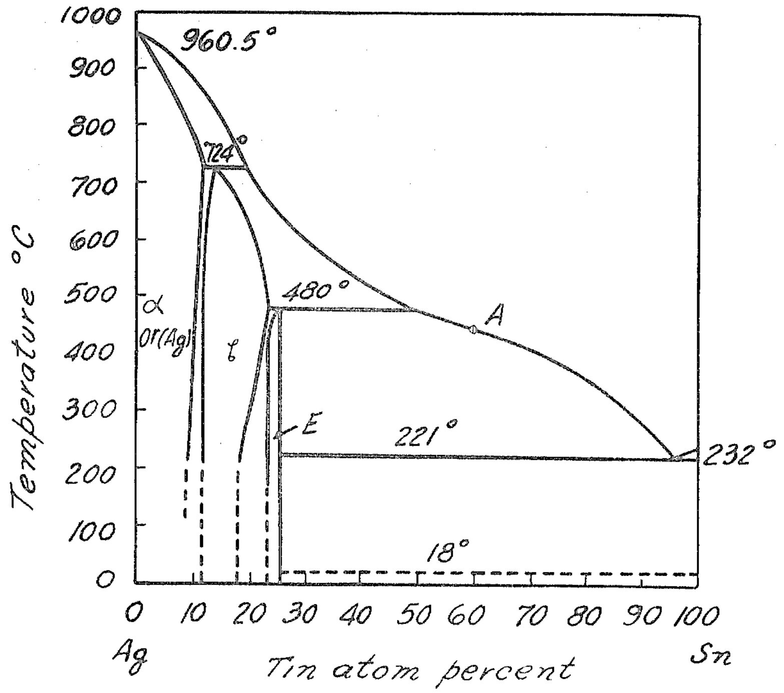
FIG. 2 is a phase diagram of a silver-tin binary alloy for use in the face-down-bonding according to the preesnt invention.

With reference to FIG. 1 (*a*) to (*g*) and FIG. 2, a first embodiment in which silver is used as the first metal and tin as the second metal will be described hereunder. Referring first to FIG. 1 (*a*), a 1 mm.-thick molybdenum plate 101 is provided and is etched with a mixed solution of ammonia and hydrogen peroxide. This etching is intended to form a thin film of molybdenum trioxide over the surface of the molybdenum plate. Next, except for the portions corresponding to the electrode regions of a silicon wafer in which semiconductor elements have been formed, the remainder of the plate surface is coated with a film of photosensitive resin 102, and the plate is dipped in a plating bath of stannous sulfate to electroplate a tin film 103 to thickness of approximately 20 microns. Thereafter, the photosensitive resin film 102 is removed. Since the molybdenum surface is coated with the thin film of molybdenum trioxide, the tin film 103 is rather poorly adherent to the molybdenum plate 101. Meanwhile, on the side of the silicon elements, ohmic contacts are formed of titanium 105 at the electrode regions of the silicon wafer 104 in which a plurality of semiconductor elements have been formed and they are coated with silver 106, as represented in FIG. 1 (*b*). Here, the numeral 107 designates a silicon dioxide film covering the silicon wafer. Using a semi-transparent reflector (not shown), the corresponding regions of the plate 101 and wafer 104 are brought into registry as shown in FIG. 1 (*c*). Then, by heating to 440° C., tin film 103 is fused to a globular shape and, as shown in FIG. 1 (*d*), the two members are bonded tightly together under pressure. At this point, penetration of silver into the molten tin takes place. If it is assumed here that the volume of each electrodeposited tin is $4\times10^4\mu^3$ and that of each silver layer is $6\times10^4\mu^3$, the equilibrium relationship that exists between tin and silver as diagrammatically illustrated in FIG. 2 will cause the tin to be melted completely at 440° C., while the silver will begin penetrating into the tin. In this case, at 440° C., the point A in FIG. 2 where the ratios of silver and tin are respectively 40 and 60 percent would represent the boundary between the liquid and solid phases, and therefore the amount of silver penetrating in the molten tin would be about $2.6\times10^4\mu^3$ (equivalent to about 40 percent of the silver amount). As a result, the silver fused in tin forms a solid solution epsilon E (to be called hereinafter the E layer) which is separated on the silver layer left over the electrode regions of the element. The melting point of the E layer is 480° C. Here, it is favorable to cool the silicon wafer 104 in a manner that it be kept at a lower temperature than the molybdenum plate 101, in order to facilitate the separation of the E layer. When the temperature of the molybdenum plate 101 approaches the melting point of tin, or 230° C., the molybdenum plate 101 is moved away from the molten tin and the wafer 104 is cooled down to room temperature.

Upon cooling down to the eutectic temperature (221° C.), the whole body becomes solid, where the ratio by volume of the E layer to the eutectic composition is approximately one to one. Because the tin content of the E layer is about 25 percent, it means that about 25 percent or $0.8\times10^4\mu^3$, of the original amount of tin has contributed to form the E layer having the melting point of 480° C. The resultant wafer is illustrated in FIG. 1 (*e*). Next, the silicon wafer is diced into chips of predetermined dimensions. As shown in FIG. 1 (*f*), each of the chips 120 is brought into contact with the tip portions of a wiring pattern 121 formed on a high-purity alumina substrate 108 and composed of a metallized layer 109 of molybdenum and manganese and a plated layer 110 of silver. In the same manner as above described, it is heated and fused at 440° C. The amount of tin to be fused at this time is about $3.2\times10^4\mu^3$ which is the original amount minus the portion converted into the E layer. When cooled, favorably in a manner that the temperature of the silicon chip 120 is kept lower than that of the substrate 108, the tin of $0.66\times10^4\mu^3$ is converted into the E layer having a melting point of 480° C. At this time the amount of silver on the substrate is far more than the amount of tin provided initially, and therefore part of the residual tin can be further converted into the E layer having a melting point of 480° C., by heating the assembly again at 440° C. By repeating this procedure several times, almost all of the tin initially present can be transformed into the E layer having a melting point of 480° C. In this way, all the bonding portions can be formed of the silver-tin alloy 111 having a melting point of 480° C., as shown in FIG. 1 (*g*).

It will be understood that the heat treatments involved in the above procedure may be carried out at a temperature between 232° C. and 480° C. other than 440° C. to form the E layer and also at a temperature between 480° C. and 724° C. to form a layer of zeta solid solution. It is possible to reduce the number of the heat treatments or to run out of the silver layer on the side of the substrate, by suitably controlling amounts of the tin and the silver layer and the temperature of the heat treatments.

Next, a second embodiment of the invention using gold as the first metal and lead as the second metal will be described. Molybdenum is deposited by evaporation on one side of a transparent plate glass, and its surface excepting the portions corresponding to the electrode regions of a silicon wafer is coated with a photosensitive resin, and then the glass plate with such coating is dipped in a plating bath of lead borofluoride to form an electrodeposit of lead of a thickness of approximately 20 microns. Following this, the photosensitive resin film is removed and the glass plate is dipped in a mixed solution of hydrogen peroxide and ammonia so as to remove the exposed layer of molybdenum previously formed by evaporation. While, on the side of the silicon wafer, electrodes are formed of platinum making ohmic contacts with electrode regions and titanium, platinum and gold overlaying thereon in the order mentioned. Through the transparent glass plate the corresponding regions of the glass plate and the silicon wafer are registered. This registration or mating is much easier than in the first embodiment because of the use of transparent glass.

Figure 3:
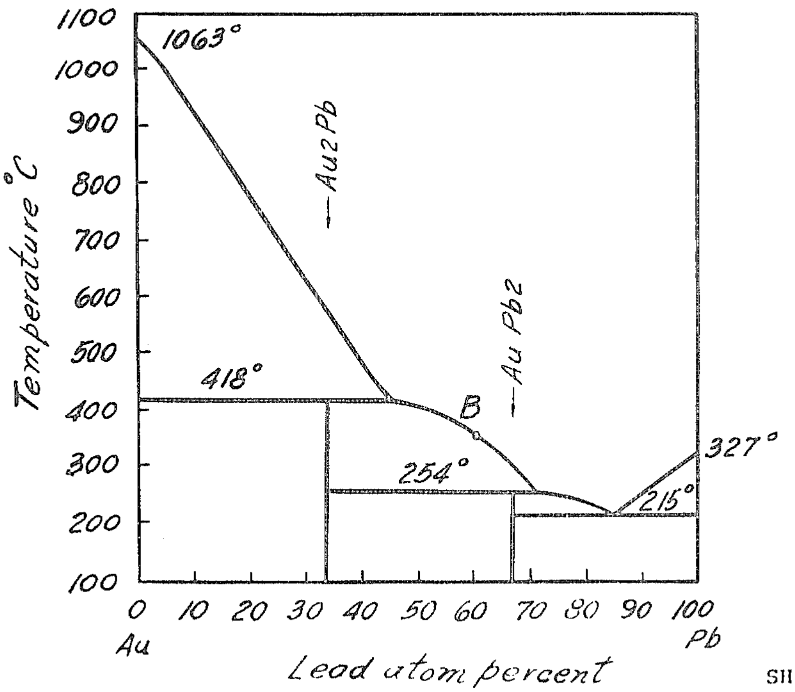
FIG. 3 is a phase diagram of a gold-lead binary alloy also for the face-down-bonding process according to the present invention.

The combination is then heated to 350° C., to melt the lead to a globular form, and then the two components are bonded together by the application of pressure. Thus the gold-lead system is heated to 350° C. to melt the lead and to penetrate the gold into the lead. Here, as can be seen from the point B in FIG. 3, the heating to a temperature of 350° C. permits the gold to penetrate into the lead until they attain ratios of about 40 percent gold and about 60 percent lead. Upon cooling, preferably in a manner that the silicon wafer is kept at a lower temperature than the molybdenum plate, separating of a $Au_2Pb$ compound having a melting point of 418° C. results. When the temperature of the molybdenum plate approaches the melting point of lead, i.e., 327° C., the plate is moved away from the molten lead and the wafer is cooled down to room temperature. It is then cut to chips of a predetermined size. Each of the chips so formed is brought into contact with predetermined parts of flat lead wires made of Kovar (trade name of an iron-nickel-cobalt alloy made by Stupakoff Ceramic and Manufacturing Co. of the U.S.A.) which is plated first with silver in order to avoid diffusion of a gold plating layer into the Kovar and then with gold. The heat treatment above described is then carried out. In this manner, the bonding portions are completely formed of the alloy of gold and lead having a melting point of 418° C.

The present invention is advantageous in the following respects. According to the prior art technique of face-down-bonding, button-like projections on the electrode regions of an element are bonded by a thermal or ultrasonic pressure bonding method to predetermined points of a wiring substrate. To attain the end, the projections must be so formed as to have equal height and the portions of the substrate against which the buttons are to be pressed must be on the same plane. Furthermore, in order that the two members be pressed evenly together, adjustments must be made so that the top ends of the projections and the portions of the substrate to be subjected to the pressure bonding are completely aligned on the same plane. If these requirements are not completely met, the pressures that are exerted upon the bonding portions will be varied, necessarily resulting in irregularity of bonding power and a serious sacrifice of reliability. In the method of the present invention, in contrast, the metal globules on the molybdenum plate which are to be transferred onto the electrode regions of the element and also the metal buttons to be bonded onto the wiring substrate are in the molten state and therefore, even if the ends of the metallic globules and buttons are somewhat irregular or the element itself is slightly inclined, the ends of all metallic globules and buttons can be readily pressed with the same pressure into contact with the substrate.

Another advantage of the present invention will become apparent from the following. In the conventional process of face-down-bonding, the projections on the electrode regions of the element are formed by build-up of aluminum by vacuum evaporation or by pressure welding of small globules of aluminum with heat. One disadvantage that is associated with the use of aluminum as the material of the projections is the poor corrosion resistance. Aluminum is not only highly susceptible to the chemical attacks of acids and alkalis but is also readily subject to the corrosive actions of aqueous solutions of watersoluble salts. Thus, for the use of aluminum as the projection material, completely hermetic sealing is necessary. Nevertheless, in the conventional practice of attaching to a substrate a semiconductor element as the active element of a thin film integrated circuit it is not considered feasible to protect the substrate as a whole with a perfectly hermetic seal, though the substrate after the investment of the element therein may sometimes be coated entirely with an insulating layer strong enough to protect the substrate against mechanical shock. On the other hand, it is a major advantage of the present invention that the combination of the wiring layer of gold, silver or the like and the tin-silver, lead-gold or similar other alloys provides by far a greater corrosion resistance than that of aluminum and therefore is capable of being used with adequate stability in elements such as those of a beam lead type integrated circuit to be exposed to the atmosphere.

A further advantage of the present invention is noted in connection with the common practice of forming the electrodes of elements. They are usually formed of aluminum or are fabricated by first making ohmic contacts with platinum, nichrome, molybdenum, titanium and the like and coating the outermost layer with gold.

Silver is not used as an electrode material because, if used, needle crystals of silver will grow out of the silver layer itself until, for example, the emitter region and base region of an element may be short-circuited. According to the present invention, such a possibility of short-circuiting due to the growth of needle crystals is precluded by the alloying of the silver layer with tin.

Where molybdenum used in the above embodiments was replaced by chromium, tungsten, or titanium, similar advantageous effects were achieved. Notably the experiments showed that where chromium is used it may be supplanted by a chromium-plated plate of a different metal.

Figure 4:
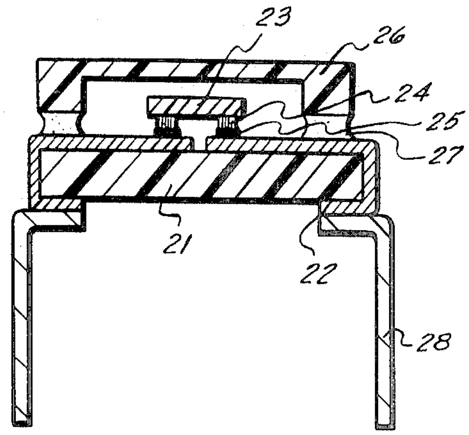
FIG. 4 is a cross sectional view of a face-down-bonded semiconductor device according to a third embodiment of this invention.
Figure 5:
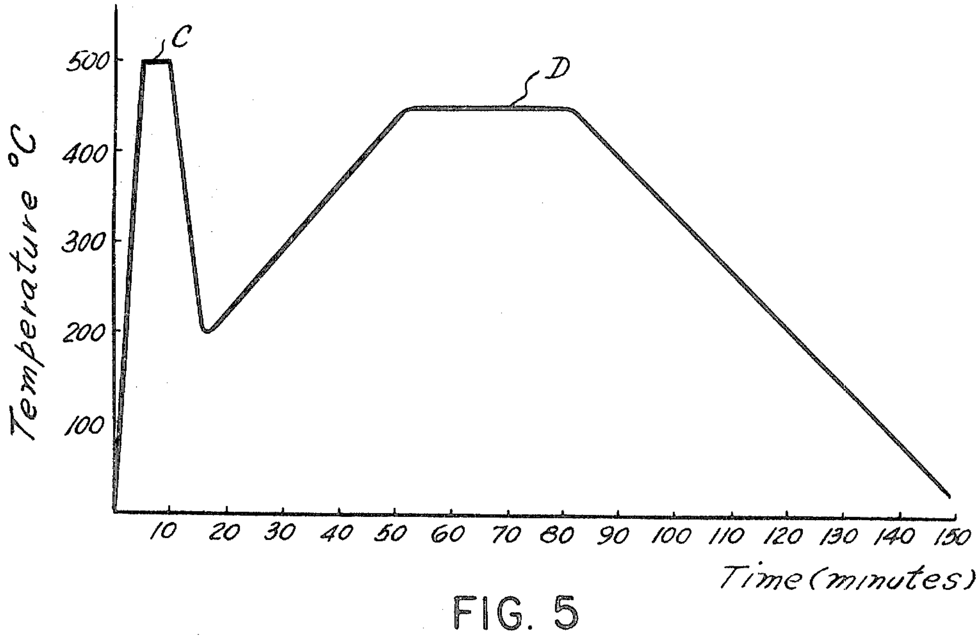
FIG. 5 is a graph showing a temperature schedule for a low-melting-point devitrified glass in a case sealing process according to the third embodiment of this invention.

Referring now to FIG. 4 which shows a third embodiment of the invention, a semiconductor element 23 has projections 24 of a tin-silver alloy with an eutectic composition (tin 96.5%, silver 3.5%). A substrate 21 is made of alumina ceramics, and thereon molybdenum-manganese wiring layers 22 plated with nickel are formed. On one end of each wiring layer 22, a plated silver layer 25 is provided, while to the other end thereof a lead-out wire 28 made of an iron-nickel-cobalt alloy is connected. At first, the projections 24 are attached to the silver layer 25 by way of either or a combination of thermo-compression bonding and ultrasonic bonding. Then, a cap 26 of alumina ceramic is sealed to the substrate 21 by use of a low-melting-point devitrified glass 27 consisting essentially of lead oxide, zinc oxide and boron oxide, for example consisting of 72% PbO, 10% ZnO, 15% $B_2O_3$, and the residual $SiO_2$ and CaO. In this case, the amount of tin involved in each projection 24 is about $4\times10^5\mu^3$ and the remaining amount of silver is about one thirtieth thereof, while each silver layer 25 has the amount of about $6\times10^5\mu^3$. In the sealing work which is carried out according to the temperature schedule shown in FIG. 5, the assembly is at first heated to 500° C., as indicated by C in FIG. 5, in order to make good adherence of the glass 27 to the ceramic members 21, 26. With this, the projections 24 completely melt and a considerable amount of silver mixes into the molten tin. Then, the temperature is lowered to 200° C. for facilitating the crystallization or devitrification of the glass. It follows that a zeta solid solution having a melting point of 724° C. is separated from the molten tin and silver to the amount of about 30 percent of the whole (i.e. about $3\times10^5\mu^3$). The assembly is again heated to 450° C., as indicated by D, in order to crystallize or devitrify the glass. Parts of the projections 24 except for the zeta solid solution are again molten, but the semiconductor element 23 will not move or shift because it is supported by the parts of the zeta solid solution. After the glass is sufficiently crystallized, the assembly is cooled to room temperature. This results in that about 50% ($4\times10^5\mu^3$) of the molten parts being separated as an epsilon solid solution having a melting point of 480° C. Although some amount of tin remains not involved in the zeta and epsilon solid solutions, it does not affect the mechanical strength of the bonding portions, bacause it resides in spaces of the solid solutions which have grown to bridge the electrodes of the semiconductor element and the substrate.

Thus, according to this embodiment, the sealing work of the casing and the transformation of the bonding portions into a high-melting-point metal can be carried out in a single procedure, and hence a reliable semiconductor device is obtainable through reduced numbers of manufacturing steps. It has been confirmed that a similar result is obtained if pure tin is used for the projections 24. Also, it is possible to use silver for the projection 24 and tin or tin-silver eutectic alloy for the layer 25. Other low-melting-point devitrified glass or usual low-melting-point glass than $PbO$-$ZnO$-$B_2O_3$ system glass may be employed, provided that its working temperature is from 232° C. to 960° C., preferably to 600° C. If a usual low-melting-point glass is employed, two heating steps as in the schedule of FIG. 5 will not be necessary, but one heating step will suffice.

Figure 6:
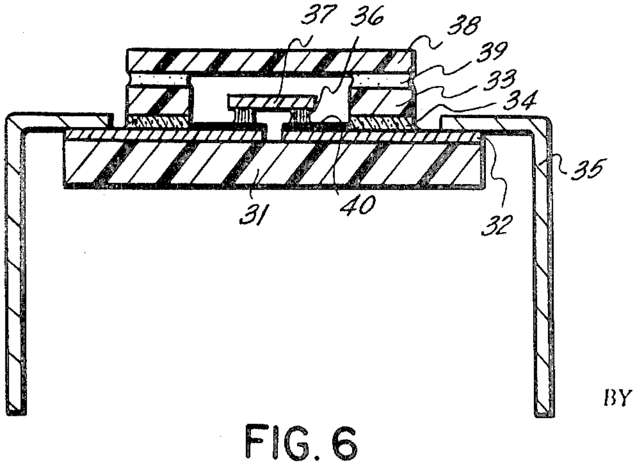
FIG. 6 is a cross-sectional view of a face-down-bonded semiconductor device according to a fourth embodiment of this invention.

With reference to FIG. 6, a semiconductor device of a fourth embodiment of the invention comprises a semiconductor element 37 having projections 36 of lead, each projection amounting to the volume of $5\times10^5\mu^3$. A ceramic substrate 31 is provided with metallic wiring layers 32 plated with nickel. To substrate 31 a ceramic wall member 33 is preliminarily fixed by use of a high-melting-point glass 34, for example Kovar-seal glass. Lead-out wires 35 are soldered to the wiring layers 32. A gold layer 40 amounting to $5\times10^5\mu^3$ is plated to a part of each wiring layer 32 at the inside of the wall member 33. The semiconductor element 37 is first attached to the substrate 31 by face-down-bonding, and thereafter a ceramic plate 38 is attached to the wall member 33 by use of a $Tl_2O$-$PbO$-$B_2O_3$ system low-melting-point glass 39 by heating the assembly once at 350-C. to 400° C. to hermetically seal the casing. As a result, $Au_2Pb$ alloy is formed at the bonding portions. In addition, it is possible to use a lead-gold eutectic alloy (lead 84%, gold 16%) in place of lead for the projections. In this case, amounts of each gold layer and projection are for example $4.05\times10^5\mu^3$ and $5.95\times10^5\mu^3$, respectively.

While the description of metals for bonding has been restricted to the combinations of silver-tin and gold-lead in the disclosed embodiments, such other combinations as palladium-lead, platinum-lead and platinum-tin proved to be just as beneficial. As for the element electrodes and substrate electrodes, they need only possess a surface layer formed of a desired metal of the first group, e.g., silver, gold, palladium or platinum. They may be a single layer or may be a multiple layer wherein any such metal is combined with another suitable metal.

Although the present invention has been described in connection with certain combinations of materials in the embodiments thereof, it should of course be obvious that the description is merely by way of exemplification and is in no way limitative thereto.

We claim:

1. A method of manufacturing a face-down-bonded semiconductor device comprising the steps of; providing a layer consisting of a first metal on the electrodes of a semiconductor device comprising the steps of providing metal capable of forming an alloy of a higher melting point than that of itself when alloyed with said first metal, said second metal layer being provided in a pattern corresponding to the electrodes of said element on a plate member having on its surface a third metal having low adhesion to said second metal to permit relatively easy removal of said second metal from the surface of said plate member; melting said second metal by the application of heat, causing said second metal in its molten state to become firmly attached to said electrodes of said element at the surface of said first metal, removing said plate member from the second metal firmly attached to said element, thereby to form metallic projections on the electrodes of said element, placing said semiconductor element on a substrate having a wiring pattern formed on the surface thereof and having an electrode surface formed of said first metal in a manner such that said projections adhere firmly to the electrodes, and producing by heating an alloy of said first and second metals between the electrodes of said element and those of said substrate by the application of heat.

2. The method of manufacturing a face-down-bonding semiconductor device as claimed in claim 1, further comprising the steps of; enclosing, after placing said semiconductor element on said substrate, said semiconductor element in a case by the use of a sealing material having a working temperature greater than the melting point of the metal of said projections disposed between said case and said substrate, and heating said sealing material at its working temperature, whereby the sealing of said case and the bonding of said semiconductor element to said substrate are effected at the same time.

3. The method of manufacturing the face-down-bonded semiconductor device as claimed in claim 2, wherein said first metal is selected from the group consisting of gold, silver, platinum and palladium, wherein said second metal is selected from the group consisting of tin and lead, wherein said third metal is selected from the group consisting of chromium, molydenum, tungsten and titanium, and wherein said layer of said second metal is electroplated onto said plate member.

4. The method of manufacturing the face-down-bonded semiconductor device as claimed in claim 1, wherein said first metal is selected from the group consisting of gold, silver, platinum and palladium, wherein said second metal is selected from the group consisting of tin and lead, wherein said third metal is selected from the group consisting of chromium, molybdenum, tungsten and titanium, and wherein said layer of said second metal is electroplated onto said plate member.

References Cited

UNITED STATES PATENTS

| | | | |
|---|---|---|---|
| 3,140,527 | 7/1964 | Valdman et al. | 29—589 UX |
| 3,182,118 | 5/1965 | De Proost et al. | 29—589 X |
| 3,212,160 | 10/1965 | Dale et al. | 29—589 UX |
| 3,373,481 | 3/1968 | Lin et al. | 29—589 X |
| 3,429,040 | 2/1969 | Miller | 317—234/5 |
| 3,440,717 | 4/1969 | Hill | 29—589 X |
| 3,456,159 | 7/1969 | Davis, Jr., et al. | 317—234/5 |
| 3,470,611 | 10/1969 | McIver et al. | 29—589 X |
| 3,488,840 | 1/1970 | Hymes et al. | 29—626 |

OTHER REFERENCES

IBM Technical Disclosure Bulletin by Chu and Roberts, vol. 10, No. 1, June 1967, "Electrical Contacts For Semiconductor chips," p. 96.

IBM Technical Disclosure Bulletin by Sopher and Totta, vol. 10, No. 2, July 1967, "Metal Contacts to Semiconductor Devices," p. 158.

IBM Technical Disclosure Bulletin by Grisley, vol. 10, No. 7, December 1967, "Chip Mounting Technique," p. 1057.

IBM Technical Disclosure Bulletin by Castrucci, Collins, and Pecoraro, vol. 9, No. 12, May 1967, "Terminal Metallorgy System For Semiconductor Devices," p. 1805.

JOHN F. CAMPBELL, Primary Examiner

R. J. SHORE, Assistant Examiner

U.S. Cl. X.R.

29—626

UNITED STATES PATENT OFFICE
CERTIFICATE OF CORRECTION

Patent No. 3,621,564 Dated November 23, 1971

Inventor(s) Shigezo Tanaka, et al

It is certified that error appears in the above-identified patent and that said Letters Patent are hereby corrected as shown below:

Column 7, line 67, "device comprising the steps of providing" should read -- element, providing a layer of a second --.

Signed and sealed this 10th day of October 1972.

(SEAL)
Attest:

EDWARD M.FLETCHER,JR.
Attesting Officer

ROBERT GOTTSCHALK
Commissioner of Patents